United States Patent
Mun et al.

(10) Patent No.: US 8,308,894 B2
(45) Date of Patent: Nov. 13, 2012

(54) SUBSTRATE ETCHING APPARATUS

(75) Inventors: Dae-Seung Mun, Yongin (KR); Joo-Heon Kim, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 519 days.

(21) Appl. No.: 12/458,552

(22) Filed: Jul. 15, 2009

(65) Prior Publication Data
US 2010/0012272 A1    Jan. 21, 2010

(30) Foreign Application Priority Data

Jul. 16, 2008   (KR) .................. 10-2008-0069173

(51) Int. Cl.
*H01L 21/306* (2006.01)

(52) U.S. Cl. ............... 156/345.23; 134/198; 134/902; 118/64

(58) Field of Classification Search ........... 156/345.21, 156/345.23, 345.54; 134/198, 902; 118/636, 118/64, 503
See application file for complete search history.

(56) References Cited

U.S. PATENT DOCUMENTS

| | | | | |
|---|---|---|---|---|
| 4,820,396 A | * | 4/1989 | de Masi | 204/297.07 |
| 6,589,386 B1 | * | 7/2003 | Maeda et al. | 156/345.23 |
| 6,673,195 B2 | * | 1/2004 | Chen et al. | 156/345.23 |
| 2008/0017320 A1 | * | 1/2008 | Choi et al. | 156/345.54 |
| 2010/0012272 A1 | * | 1/2010 | Mun et al. | 156/345.23 |

FOREIGN PATENT DOCUMENTS

| | | |
|---|---|---|
| JP | 2003-211027 A | 7/2003 |
| KR | 10-2008-0008610 A | 1/2008 |
| KR | 10-2008-0025492 A | 3/2008 |

OTHER PUBLICATIONS

Machine Generated English Translation of KR 1020080025492. published Mar. 21, 2008.*
Machine Generated English Translation of JP 2003-211027, published Jul. 29, 2003.*
Korean Office Action dated Jan. 21, 2010, corresponding to the Korean Patent Application No. 10-2008-0069173.

* cited by examiner

*Primary Examiner* — Sylvia R. MacArthur
(74) *Attorney, Agent, or Firm* — Robert E. Bushnell, Esq.

(57) ABSTRACT

A substrate etching apparatus includes a supporting unit for supporting substrate in a vertical position and an etching solution supply unit disposed above the substrate to supply an etching solution to the top of the substrate such that the etching solution runs down both of faces of the substrate from the top of the substrate.

18 Claims, 10 Drawing Sheets

SUBSTRATE ETCHING APPARATUS

CLAIM OF PRIORITY

This application makes reference to, incorporates the same herein, and claims all benefits accruing under 35 U.S.C. §119 from an application for SUBSTRATE ETCHING APPARATUS earlier filed in the Korean Intellectual Property Office on the 16 Jul. 2008 and there duly assigned Serial No. 10-2008-0069173.

BACKGROUND OF THE INVENTION

1. Field of the Invention

The present invention relates to a substrate etching apparatus, and more particularly, to a substrate etching apparatus for preventing the surface of a flat panel display panel from being damaged and improving thickness uniformity.

2. Description of the Related Art

Consumer's interest in reduction in the thickness of a flat panel display panel is increasing. Etching methods are used to reduce the thickness of the flat panel display panel.

The etching methods include a dipping etching method in which a flat panel display panel is dipped in an etching solution to etch the flat panel display panel, and a shower etching method in which an etching solution is sprayed to both faces of a flat panel display panel that is vertically standing to etch the flat panel display panel.

The dipping etching method has drawbacks in that thickness uniformity is low over the entire area of a flat panel display panel, etch rate deterioration speed is high, a large etching solution bath is required so that the etching solution bath is difficult to manage, and it is difficult to remove sludge generated during an etching process.

The shower etching method has limitations in reducing the thickness of a flat panel display panel because the flat panel display panel is warped when the spray pressure of an etching solution sprayed to both faces of the flat panel display panel is unbalanced.

The shower etching method has a problem in that etching solution spray nozzles can be easily clogged by sludge to stain the surface of the flat panel display panel.

Furthermore, the shower etching method requires a wide space for parallel etching because it uses nozzles that spray an etching solution to both faces of the flat panel display panel. The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a substrate etching apparatus having advantages of preventing the surface of a flat panel display panel from being damaged and improving thickness uniformity. An exemplary embodiment of the present invention provides a substrate etching apparatus for preventing the surface of a flat panel display panel from being damaged and improving thickness uniformity. Another exemplary embodiment of the present invention provides a substrate etching apparatus for reducing a space required for etching when substrate etching apparatuses are arranged in parallel and in series, and for improving space utilization and productivity.

A substrate etching apparatus for etching a substrate according to an exemplary embodiment of the present invention includes a supporting unit supporting the substrate in a vertical position and an etching solution supply unit disposed above the substrate and supplying an etching solution to the top of the substrate such that the etching solution flows down both of a front and a back faces of the substrate.

The supporting unit may include a first supporting member supporting the bottom of the substrate flat panel display panel in a vertical position, a second supporting member supporting one side of the substrate in the vertical position, and a third supporting member supporting another both sides of the substrate in the vertical position.

The second supporting member may be fixed in a position, and the third supporting member may be movable.

The first supporting member may have a first concave groove to support the bottom of the substrate, the second supporting member may have a second concave groove to support the one side of the substrate, and the third supporting member may have a third concave groove to support the another side of the substrate.

The etching solution supply unit may include a first distribution pipe distributing an etching solution that is supplied from a pump unit, a second distribution pipe including the first distribution pipe and secondarily distributing the etching solution distributed by the first distribution pipe, and a guide including the second distribution pipe and guiding the etching solution distributed by the second distribution pipe to the top of the substrate.

The first distribution pipe may have a plurality of nozzles that distribute the etching solution and are arranged downwardly. The second distribution pipe may have an opening that is formed upwardly and has protrusions and depressions formed along the length of the second distribution pipe.

The first distribution pipe may have a slot hole that distributes the etching solution and is formed downwardly. The second distribution pipe may have an opening that is formed opposite to the slot hole to distribute the etching solution, and has protrusions and depressions formed along the length of the second distribution pipe.

The guide may have an open top through which the etching solution spills. The guide may have a first side wall and a second side wall, both of which meet at a bottom of the guide forming a bottom line. The bottom line is aligned along the top of the substrate.

The pump unit may include a first pump and a second pump. The first pump may be connected to one end of the first distribution pipe to supply the etching solution, and the second pump may be connected to another end of the first distribution pipe to supply the etching solution.

The etching solution supply unit may include a first distribution pipe distributing an etching solution that is supplied from a pump unit, and a second distribution pipe including the first distribution pipe and guiding the etching solution distributed by the first distribution pipe to the top of the substrate.

The flat panel display panel may include an organic light emitting diode display.

The present invention also provides a substrate etching system, which includes a first substrate etching apparatus for etching a substrate, and a second etching apparatus for etching a substrate. Each of the first and the second etching apparatuses includes a supporting unit supporting the substrate in a vertical position, and an etching solution supply unit disposed above the substrate, and supplying an etching solution to a top of the substrate such that the etching solution flows down both of a front and a back faces of the substrate. The first and the second etching apparatuses are arranged in a manner that the faces of the substrates of the first and the second etching apparatus face each other.

The present invention also provides another substrate etching system, which includes a first substrate etching apparatus for etching a substrate, and a second etching apparatus for etching a substrate. Each of the first and the second etching apparatuses includes a supporting unit supporting the substrate in a vertical position, and an etching solution supply unit disposed above the substrate, and supplying an etching solution to a top of the substrate such that the etching solution flows down both of a front and a back faces of the substrate. The first and the second etching apparatuses are arranged in a manner that the sides of the substrates of the first and the second etching apparatus face each other.

As described above, according to an exemplary embodiment of the present invention, the etching solution runs down from the top end of the flat panel display panel in a vertical state to etch both faces of the flat panel display panel, and thus thickness uniformity is improved while the vertical surface of the flat display panel is prevented from being damaged.

Furthermore, according to an exemplary embodiment of the present invention, etching solution supply units can be arranged in parallel and in series to reduce a space required for etching and improving space utilization and productivity.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
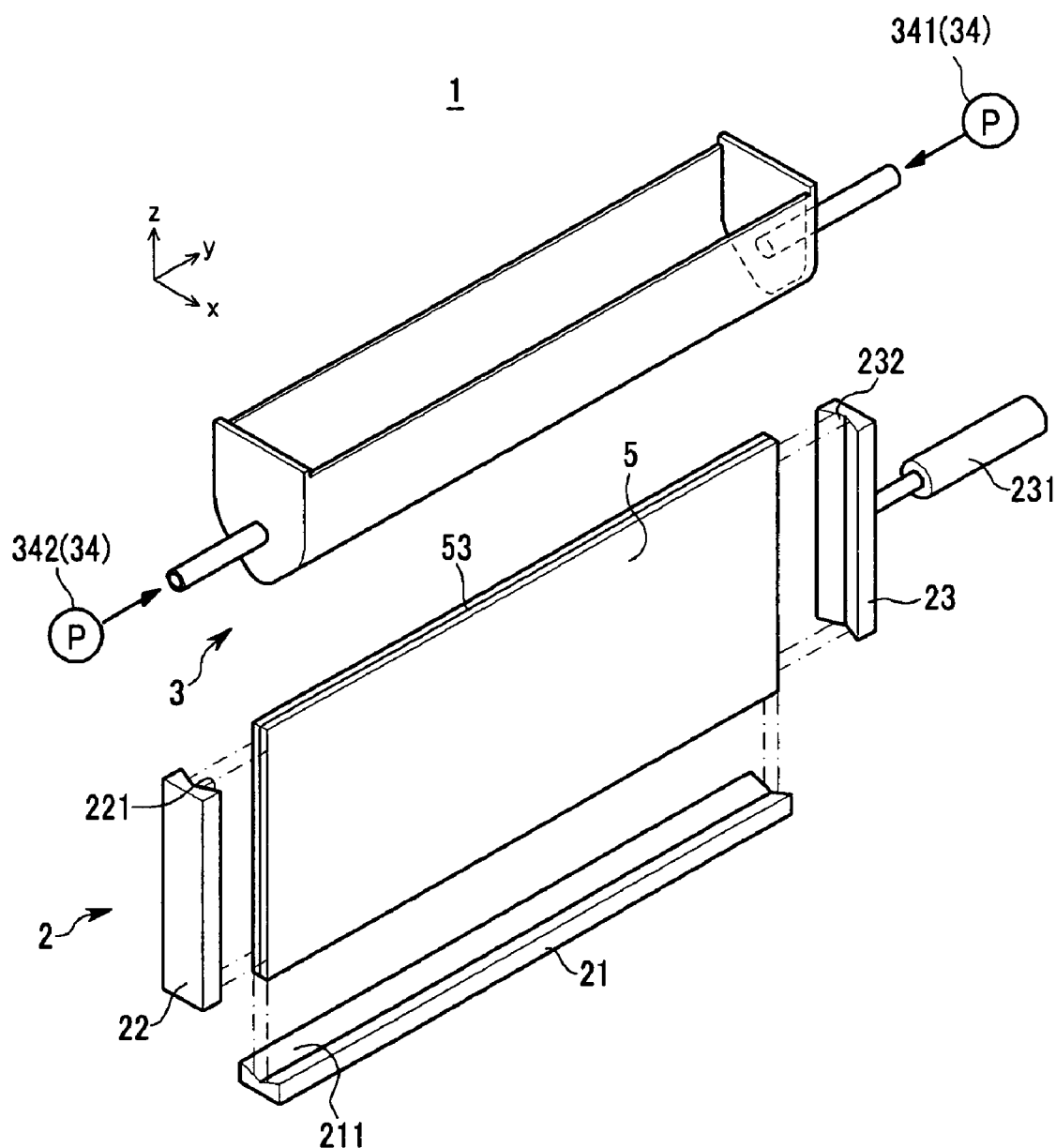
FIG. 1 is an exploded perspective view of a substrate etching apparatus according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

FIG. 1 is an exploded perspective view of a substrate etching apparatus according to an exemplary embodiment of the present invention. Referring to FIG. 1, the substrate etching apparatus 1 according to an exemplary embodiment of the present invention includes a supporting unit 2 and an etching solution supply unit 3.

The supporting unit 2 supports a substrate 5 in a vertical position (along z-axis direction) while both of a front and back faces of the substrate 5 are etched using an etching solution. The thickness of the substrate after etching may be reduced. The substrate 5 can be a flat panel display panel, if the flat panel display panel is about to be etched.

The etching solution supply unit 3 is disposed above the supporting unit 2, and is aligned corresponding to the substrate 5. The etching solution supply unit 3 supplies an etching solution to both of a front and back faces of the substrate 5 from a top line 53 of the substrate 5 such that the etching solution uniformly runs down both faces of the substrate 5 to the bottom of the substrate 5.

That is, the etching solution supply unit 3 is provided in the length direction (y-axis direction) of the substrate 5 and uniformly supplies the etching solution along the top line 53 of the substrate 5 to both faces of the substrate 5 by gravity.

The substrate 5, which can be reduced in thickness, can include a liquid crystal display (LCD), a plasma display panel (PDP), and an organic light emitting diode (OLED) display. For convenience, the present exemplary embodiment exemplifies the OLED display.

Figure 2:
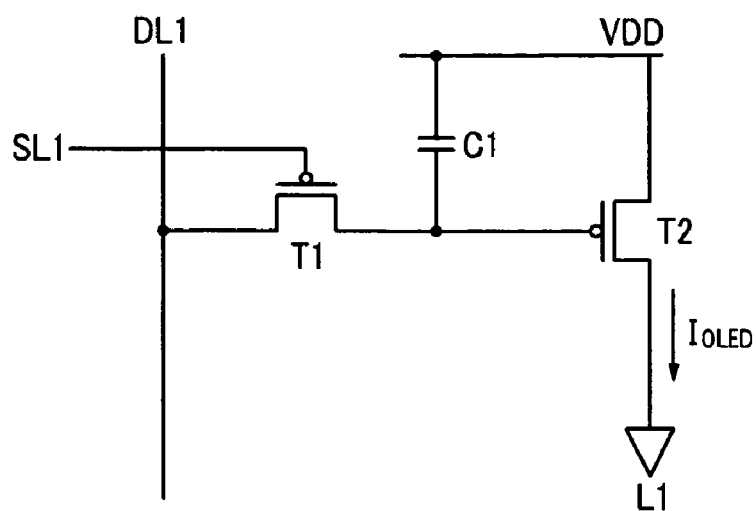
FIG. 2 is a schematic diagram showing a sub-pixel circuit structure of a flat panel display panel illustrated in FIG. 1.
Figure 3:
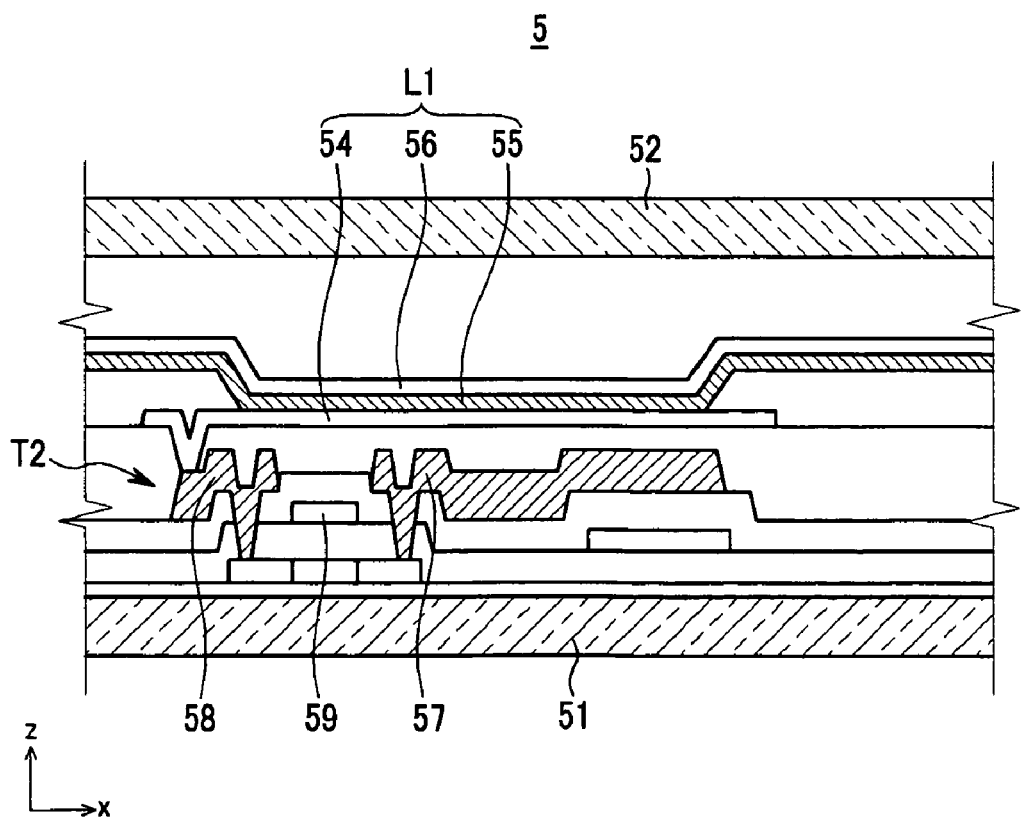
FIG. 3 is a cross-sectional view of the flat panel display panel illustrated in FIG. 1.

FIG. 2 is a schematic diagram of a sub-pixel circuit structure of the flat panel display panel illustrated in FIG. 1, and FIG. 3 is a cross-sectional view of the flat panel display panel illustrated in FIG. 1.

Referring to FIGS. 2 and 3, a sub-pixel of an OLED display includes an organic light emitting element L1 and a driving circuit. The organic light emitting element L1 includes an anode 54, an organic emission layer 55, and a cathode 56. The driving circuit includes at least two thin film transistors and at least one storage capacitor C1. The thin film transistors basically include a switching transistor T1 and a driving transistor T2. The switching transistor T1 is connected to a scan line SL1 and a data line DL1, and transmits a data voltage input from the data line DL1 to the driving transistor T2 according to a switching voltage input to the scan line SL1.

The storage capacitor C1 is connected to the switching transistor T1 and a power supply line VDD, and stores a voltage corresponding to a difference between the voltage transmitted from the switching transistor T1 and a voltage supplied from the power supply line VDD.

The driving transistor T2 is connected to the power supply line VDD and the storage capacitor C1, and provides an output current $I_{OLED}$ in proportion to the square of the difference between the voltage stored in the storage capacitor C1 and the threshold voltage thereof to the organic light emitting element L1. The organic light emitting element L1 emits light according to the output current $I_{OLED}$.

The driving transistor T2 includes a source electrode 57, a drain electrode 58, and a gate electrode 59, and the anode 54 of the organic light emitting element L1 can be connected to the drain electrode 58 of the driving transistor T2. The sub-pixel is not limited to the aforementioned configuration and can be varied.

A front substrate 52 and a rear substrate 51 are sealed and have a gap therebetween to protect driving circuits and organic light emitting elements L1 formed on the rear substrate 51.

A substrate 5 conveyed to the substrate etching apparatus 1 according to an exemplary embodiment of the present invention includes a plurality of OLED displays, each of which forms a single cell. The substrate 5 passes through a thinning process and then a cutting process of cutting the substrate into respective cells to form a plurality of OLED displays.

Referring back to FIG. 1, the supporting unit 2 supports the substrate 5 that is conveyed in a vertical state into the substrate etching apparatus. When the substrate 5 is etched using an etching solution, the flow of the etching solution can be smoothly guided without disturbing the flow of the etching solution.

The supporting unit 2 can include first, second, and third supporting members 21, 22, and 23 that respectively support three of four sides of the substrate 5.

The first supporting member 21 is located under the substrate 5 in the y-axis direction to support the bottom of the substrate 5 to be vertically standing. The first supporting member 21 can be vertically moved in the z-axis direction or can be fixed.

The first supporting member 21 has a first concave groove 211 to prevent the flow of the etching solution from being disturbed, and to support the bottom of the substrate 5. The first concave groove 211 supports the substrate 5 and discharges the etching solution running down through both faces of the substrate 5 when the substrate 5 is etched.

The second supporting member 22 and the third supporting member 23 are arranged in the z-axis direction to respectively support both sides of the substrate 5 of which the bottom is supported by the first supporting member 21. The second supporting member 22 supports one side of the substrate 5, and the third supporting member 23 support another side of the substrate 5.

Both of the second and third supporting members 22 and 23 can move in the y-axis direction or only one of the second and third supporting members 22 and 23 can move in the y-axis direction. For convenience of explanation, it can be described that the second supporting member 22 is fixed and the third supporting member 23 moves in the y-axis direction toward the second supporting member 22 in the present exemplary embodiment of the invention. That is, the third supporting member 23 is connected to a driving member 231, which can have a cylindrical shape, to be moved in the y-axis direction. The third supporting member 23 moves towards or away from the second supporting member 22 in the y-axis direction by the driving member 231 such that the second and third supporting members 22 and 23 respectively support both sides of the substrate 5 in the y-axis direction.

The second and third supporting members 22 and 23 respective have second and third concave grooves 221 and 232 to prevent the flow of the etching solution from being disturbed and support both sides of the substrate 5. The second and third concave grooves 221 and 232 support the substrate 5 and guide the etching solution running down through two faces of the substrate 5 while the substrate is being etched.

The substrate 5 is continuously and individually conveyed to the supporting unit 2 according to an additional conveying device (not shown), and the bottom and one side of the substrate 5 are respectively supported by the first and second supporting members 21 and 22 while the other side thereof is supported according to forward movement of the third supporting member 23.

In this manner, the first, second, and third supporting members 21, 22, and 23 support the substrate 5, and thus preparation for etching the substrate using the etching solution is completed. The etching solution supply unit 3 uniformly supplies the etching solution to the top of the substrate 5 supported by the supporting unit 2.

Figure 4:
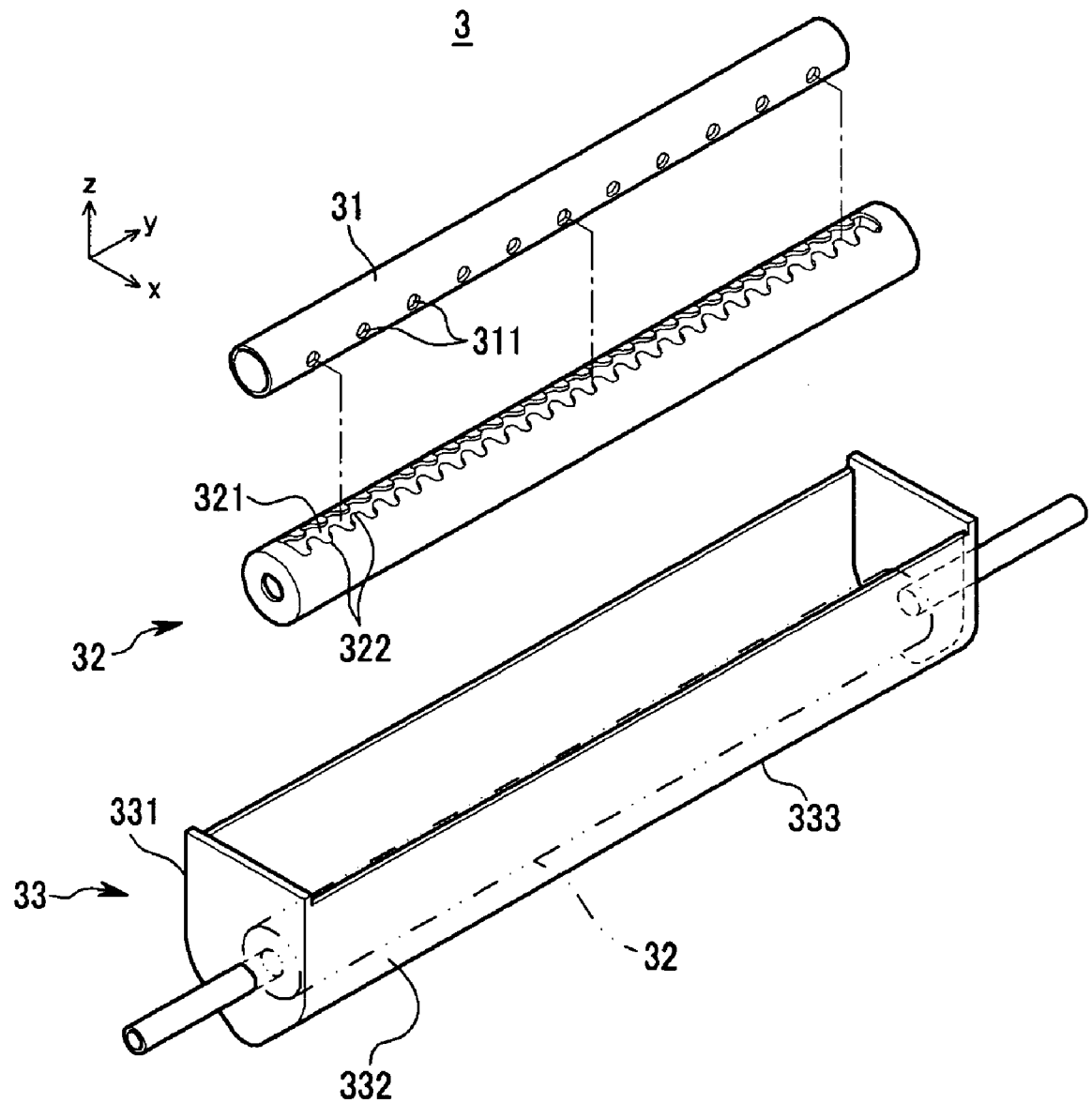
FIG. 4 is an exploded perspective view of an etching solution supply unit illustrated in FIG. 1 according to a first exemplary embodiment of the present invention.
Figure 5:
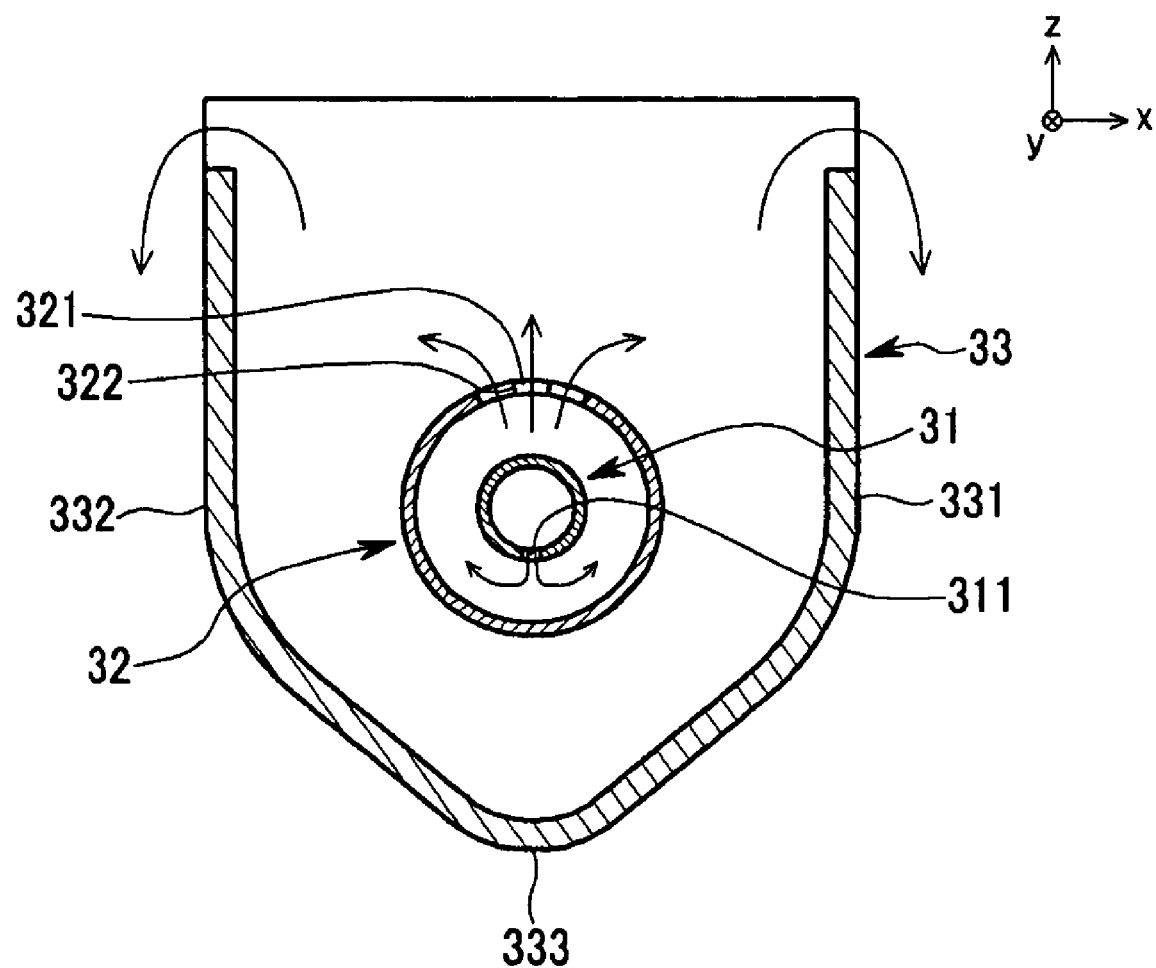
FIG. 5 is a cross-sectional view of the etching solution supply unit illustrated in FIG. 1.

FIG. 4 is an exploded perspective view of the etching solution supply unit illustrated in FIG. 1 according to a first exemplary embodiment of the present invention, and FIG. 5 is a cross-sectional view of the etching solution supply unit illustrated in FIG. 1.

Referring to FIGS. 4 and 5, the etching solution supply unit 3 has a bottom line 333 aligned corresponding to the top line 53 of the substrate 5, which extends in the y-axis direction. The etching solution supply unit 3 supplies the etching solution to both faces of the substrate 5, and includes a first distribution pipe 31, a second distribution pipe 32, and a guide 33.

The first distribution pipe 31 is disposed parallel to the top line 53 of the vertically standing substrate 5 and primarily distributes the etching solution that is pressure-transferred from a pump unit 34 along the top line 53 of the substrate 5.

The first distribution pipe 31 includes a plurality of nozzles 311 disposed at predetermined intervals along the y-axis direction to distribute the etching solution along the y-axis direction. The nozzles 311 are arranged downwardly in the second distribution pipe 32 in order to primarily distribute the etching solution that is pressure-transferred from the sides of the first distribution pine 31.

The nozzles 311 primarily distribute the etching solution that is pressure-transferred to the first distribution pipe 31 over the entire length of the first distribution pipe 31 and forces the etching solution into the second distribution pipe 32.

Referring back to FIG. 1, the pump unit 34 includes a first pump 341 and a second pump 342 respectively connected to ends of the first distribution pipe 31 in order to prevent etching solution distribution pressure from decreasing at one end of the first distribution pipe 31.

The first pump 341 and the second pump 342 pressure-transfer the same quantity of etching solution to reduce an etching solution distribution pressure difference in the overall length of the first distribution pipe 31.

The second distribution pipe 32 includes the first distribution pipe 31, and secondarily distributes the etching solution that is distributed by the first distribution pipe 31 to further reduce the etching solution distribution pressure difference in the overall length of the first distribution pipe 31.

The second distribution pipe 32 has an opening 321 formed in an opposite direction from to the nozzles 311. In other words, the opening 321 is formed upwardly, while the nozzles 311 are formed downwardly. Protrusions and depressions 322 are formed at a boundary of the opening 321. The opening 321 is formed along the length of the second distribution pipe 32 and secondarily distributes the etching solution that is primarily distributed by the first distribution pipe 31 into the guide 33.

The protrusions and depressions 322 are formed along both boundaries of the opening 321 in the direction of the length of the second distribution pipe 32, and further reduce the secondary distribution pressure difference of the etching solution distributed in the direction of the length of the opening 321 (y-axis direction) and the direction of both sides of the opening 321 (x-axis direction).

The guide 33 includes the second distribution pipe 32, and guides the etching solution distributed by the second distribution pipe 32 to the top line 53 of the substrate 5.

The guide 33 has an open top above the second distribution pipe 32 included therein such that the etching solution distributed through the opening 321 of the second distribution pipe 32 spills through the open top of the guide 33, and flows down the top of the substrate 5 and runs down both faces of the substrate 5.

Referring to FIG. 5, the guide 33 has a first side wall 331 and a second side wall 332. Both of side walls 331 and 332 of the guide 33, which respectively correspond to faces of the substrate 5, meet at the bottom to form the bottom line 333 that corresponds to the top line 53 of the substrate 5. The bottom line 333 of the guide 33 is substantially parallel to the top line 53 of the substrate 5.

Figure 6:
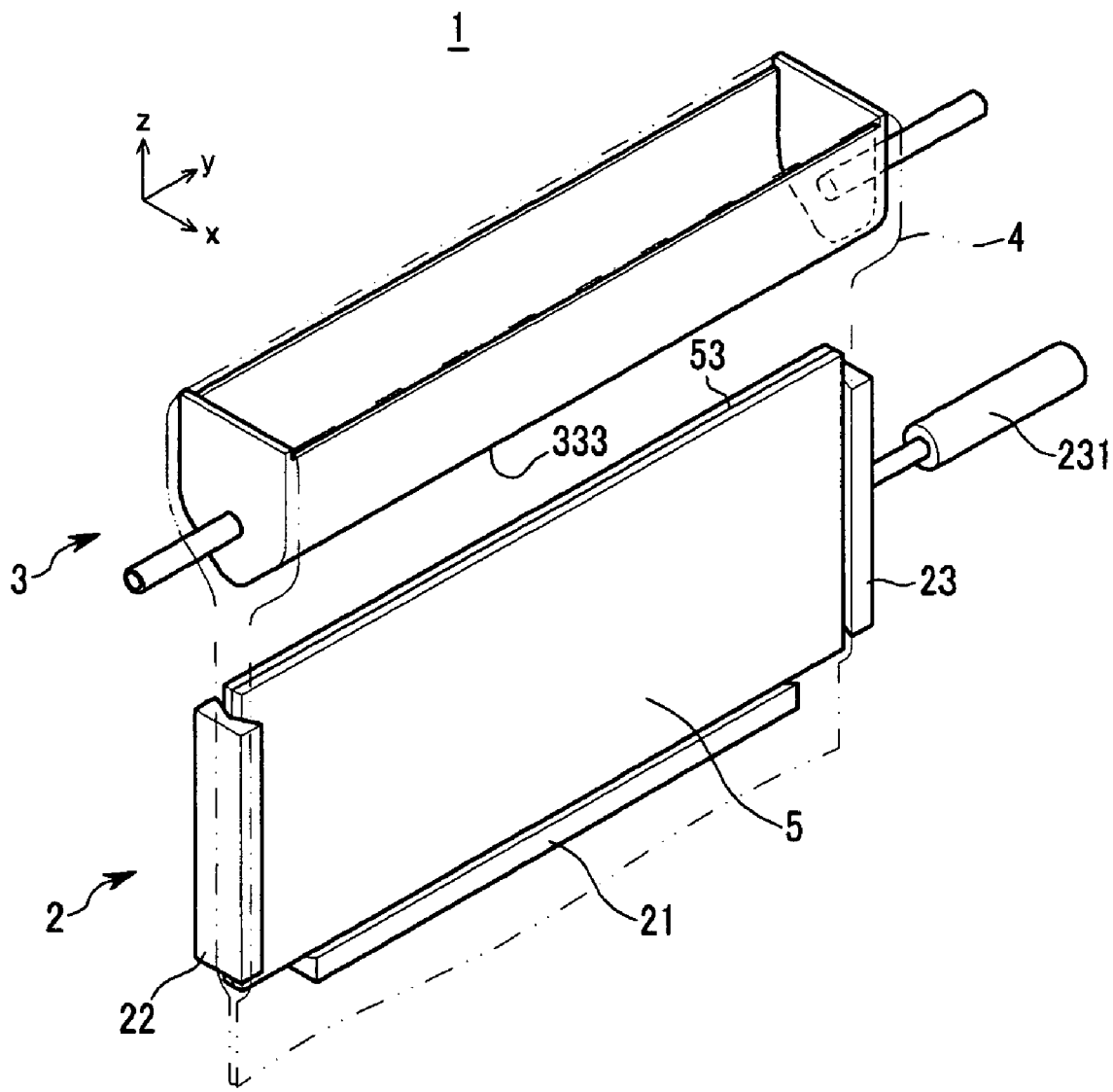
FIG. 6 is a perspective view showing a process of etching a flat panel display panel using the substrate etching apparatus illustrated in FIG. 1.
Figure 7:
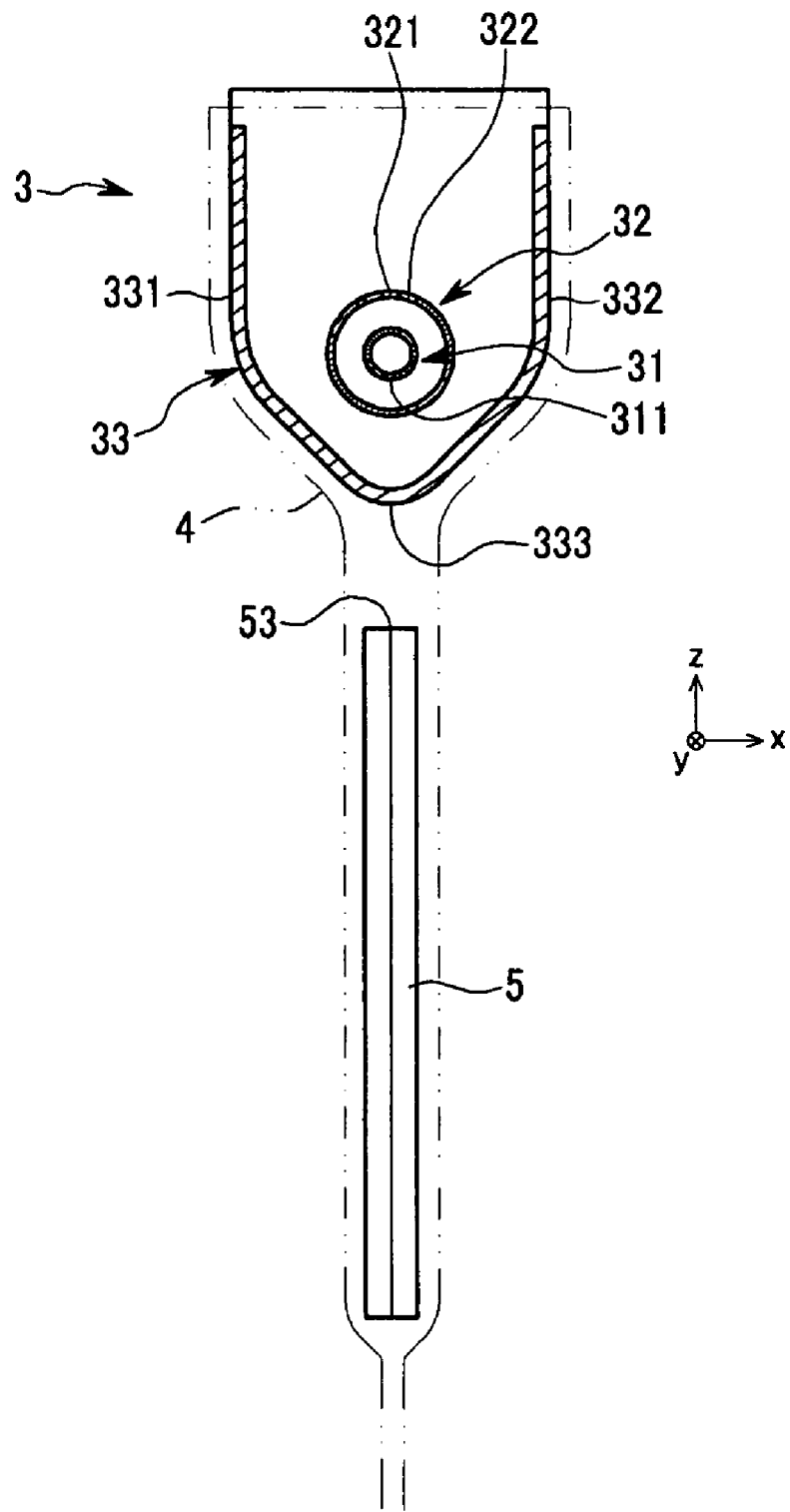
FIG. 7 is a side view of FIG. 6.

FIG. 6 is a perspective view showing a process of etching the substrate using the substrate etching apparatus of FIG. 1, and FIG. 7 is a side view of FIG. 6.

Referring to FIGS. 6 and 7, the etching solution that is pressure-transferred from the first and second pumps 341 and 342 is provided to the first distribution pipe 31 and is primarily distributed into the second distribution pipe 32 through the nozzles 311.

The primarily distributed etching solution is secondarily distributed into the guide 33 through the opening 321 and the protrusions and depressions 322 of the second distribution pipe 32.

The secondarily distributed etching solution flows over both side walls 331 and 332 of the guide 33 and is uniformly supplied to the top line 53 of the substrate 5 through the bottom line 333.

The etching solution 4 provided in this manner uniformly flows down both faces of the substrate 5 and etches both faces of the substrate 5. Accordingly, the thinned substrate 5 has a uniform thickness without having surface damage because pressure is not applied to the substrate 5 by the etching solution.

Figure 8:
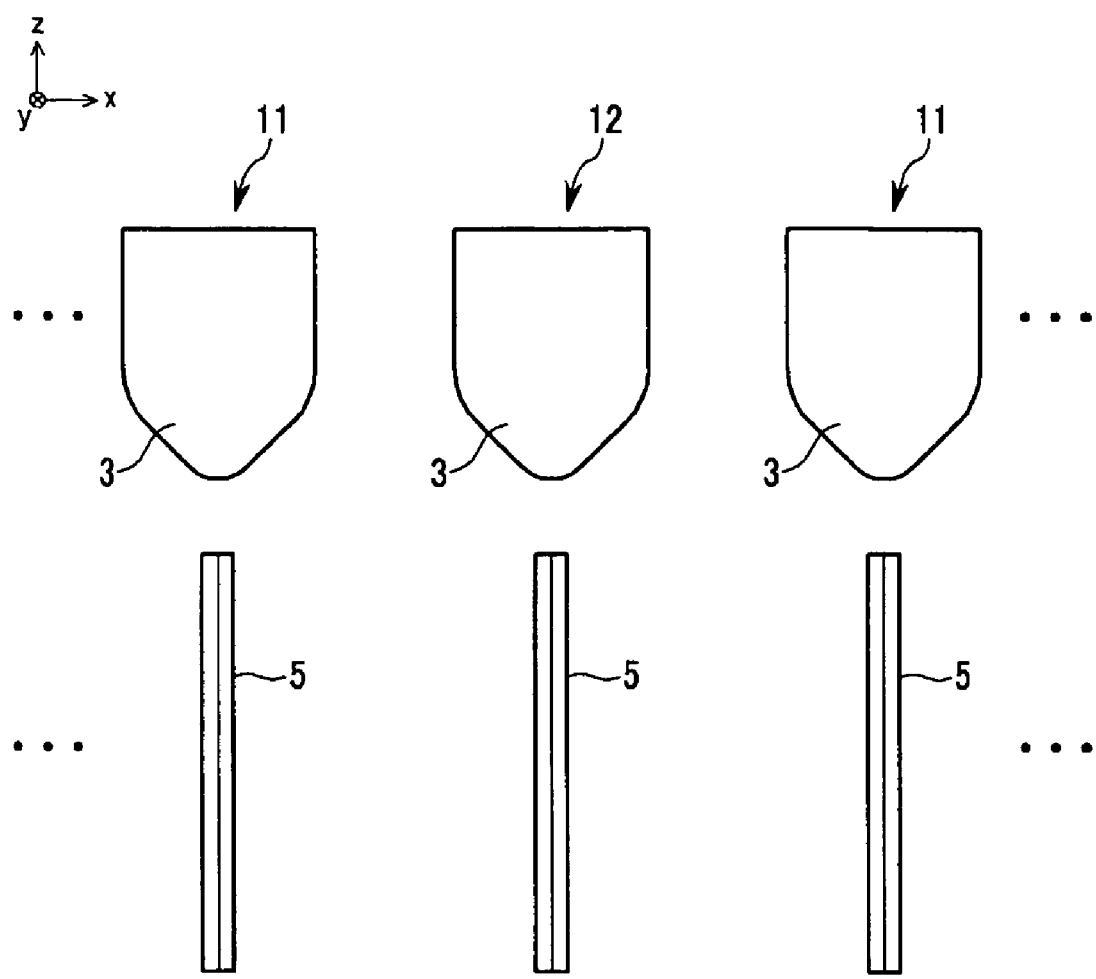
FIG. 8 shows a parallel arrangement of substrate etching apparatuses illustrated in FIG. 1.

FIG. 8 shows a substrate etching system that includes a plurality of substrate etching apparatuses illustrated in FIG. 1. Referring to FIG. 8, a plurality of neighboring substrate etching apparatuses can be arranged in parallel. For convenience, FIGS. 8 and 9 show substrates 5 without illustrating the supporting unit 2 of the substrate etching apparatus 1.

In FIG. 8, the plurality of substrate etching apparatuses, for example first and second substrate etching apparatuses 11 and 12, are disposed in a manner that faces of the substrates of the substrate etching apparatuses faces each other (yz planes). In this case, the first and second substrate etching apparatuses 11 and 12 are referred to as being arranged in parallel.

The parallel arrangement of the first and second substrate etching apparatuses 11 and 12 can allow the etching solution supply units 3 to be located above the substrates 5 to reduce the distance between the first and second substrate etching apparatuses 11 and 12, and thus a space required in the direction (x-axis direction) perpendicular to the plane (yz plane) can be decreased.

Figure 9:
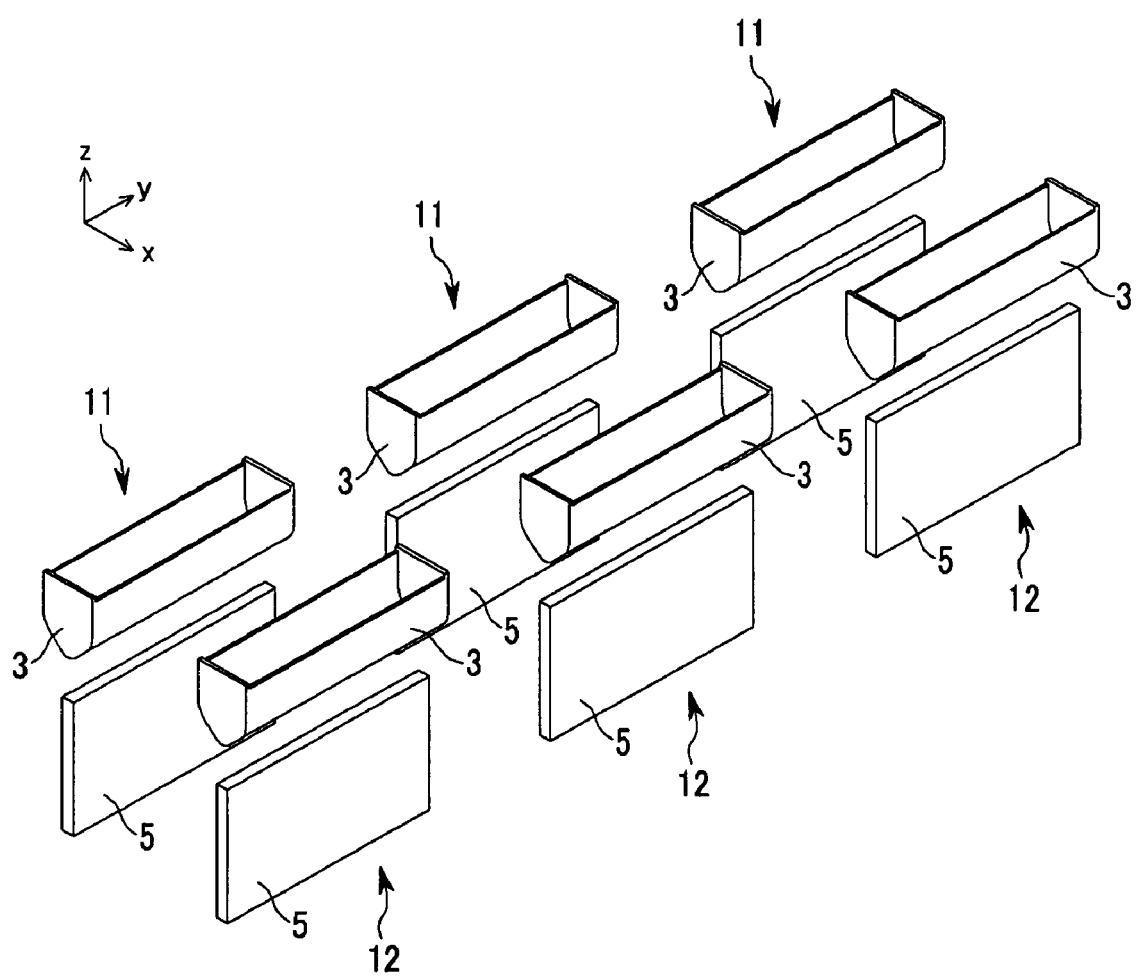
FIG. 9 shows a series arrangement of substrate etching apparatuses in addition to the parallel arrangement as illustrated in FIG. 8.

FIG. 9 shows a series arrangement of substrate etching apparatuses in addition to the parallel arrangement as illustrated in FIG. 8. Referring to FIG. 9, the first substrate etching apparatuses 11 are arranged in a row, and the second substrate etching apparatuses 12 are arranged in another row. In each column, the first and second substrate etching apparatuses 11 and 12 are arranged in parallel, as illustrated in FIG. 8. The arrangement of the substrate etching apparatuses in a row (along y-axis) is referred to as a series arrangement. In the series arrangement, sides of substrates of substrate etching apparatuses face each other, while faces of substrates of substrate etching apparatuses face each other in the parallel arrangement.

The parallel arrangement and series arrangement of the first and second substrate etching apparatuses 11 and 12 can further reduce a space required to etch the substrate 5 and improve space utilization and productivity.

Meanwhile, in the first exemplary embodiment of the present invention, the first distribution pipe can include a slot hole 611 (shown in FIG. 10) formed along the y-axis direction to distribute the etching solution along the y-axis direction.

The slot hole 611 is formed downwardly in the second distribution pipe in order to primarily distribute the etching solution that is pressure-transferred from the sides of the first distribution pipe. That is, the first distribution pipe 31 according to the first exemplary embodiment of the present invention can employ the nozzles 311 or the slot hole 611 in order to primarily distribute the etching solution.

Figure 10:
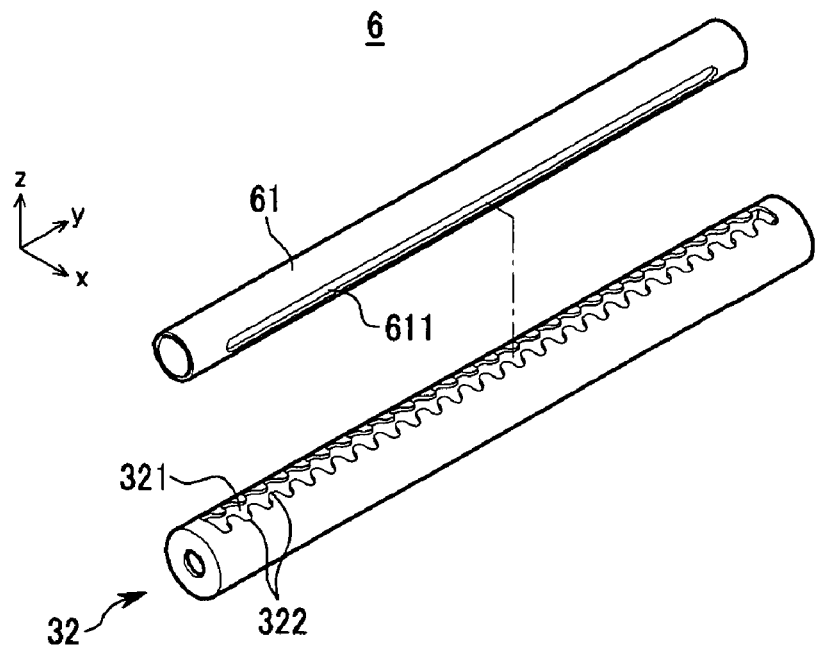
FIG. 10 is an exploded perspective view of an etching solution supply unit according to a second exemplary embodiment of the present invention.
Figure 11:
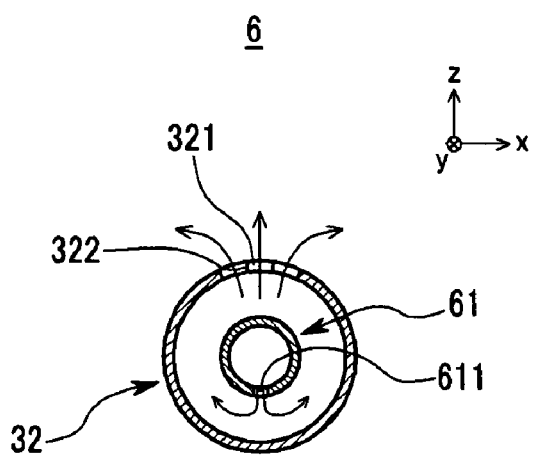
FIG. 11 is a cross-sectional view of the etching solution supply unit illustrated in FIG. 10.
Figure 12:
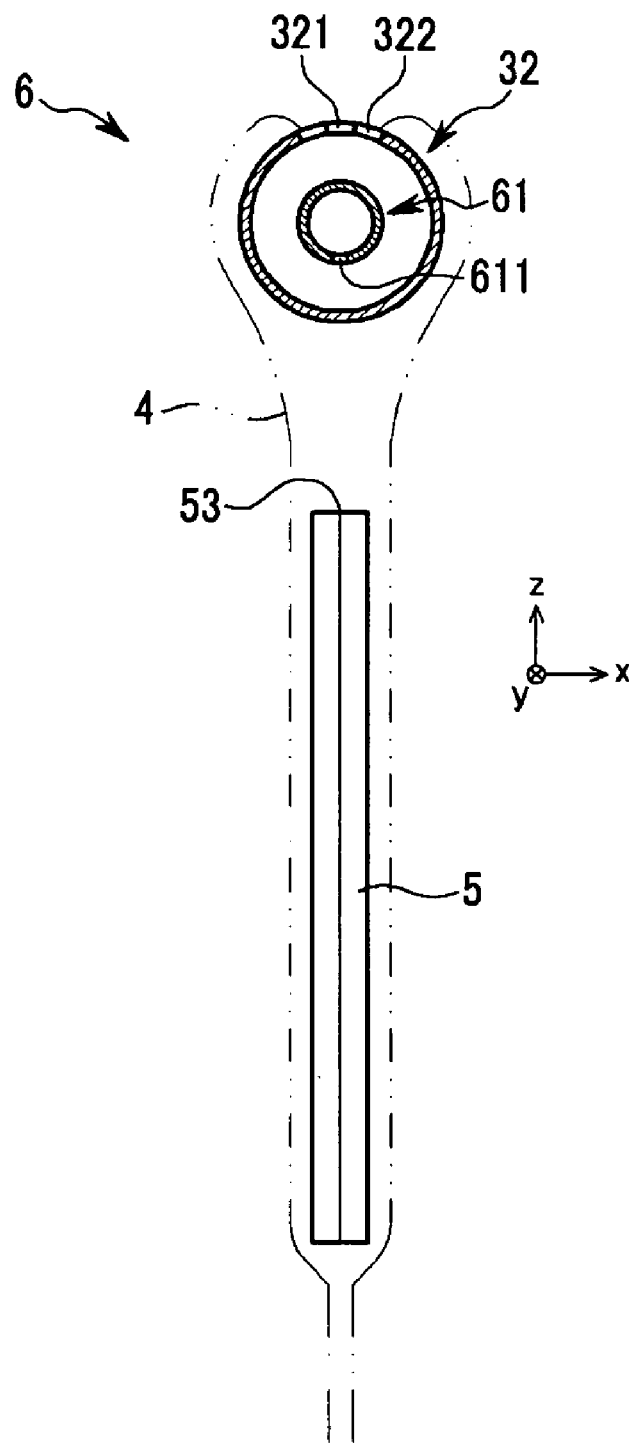
FIG. 12 is a perspective view showing a process of etching a flat panel display panel using the substrate etching apparatus illustrated in FIG. 10.

FIG. 10 is an exploded perspective view of an etching solution supply unit according to a second exemplary embodiment of the present invention, FIG. 11 is a cross-sectional view of the etching solution supply unit illustrated in FIG. 10, and FIG. 12 is a perspective view showing a process of etching a substrate using the substrate etching apparatus illustrated in FIG. 10.

Referring to FIGS. 10, 11, and 12, an etching solution supply unit 6 according to the second exemplary embodiment of the present invention includes a first distribution pipe 61 and a second distribution pipe 32.

The etching solution supply unit 3 according to the first exemplary embodiment of the present invention includes the first distribution pipe 31, the second distribution pipe 32, and the guide 33, while the etching solution supply unit 6 according to the second exemplary embodiment of the present invention includes the first and second distribution pipes 61 and 32.

That is, the etching solution supply unit 6 according to the second exemplary embodiment distributes the etching solution 4 primarily and then supply the etching solution 4 to the substrate 5, while the etching solution supply unit 3 according to the first exemplary embodiment distributes the etching solution 4 primarily and secondarily and then supply the etching solution 4 to the substrate 5.

Accordingly, the etching solution supply unit 6 according to the second exemplary embodiment distributes and supplies the etching solution 4 within a shorter time than the time required for the etching solution supply unit 3 according to the first exemplary embodiment to distribute and supply the etching solution 4.

The first distribution pipe 61 includes the slot hole 611 formed along the y-axis direction to distribute the etching solution along the y-axis direction. The slot hole 611 is formed downwardly in the second distribution pipe 32 in order to primarily distribute the etching solution that is pressure-transferred from the sides of the first distribution pine 61.

The second distribution pipe 32 can have the same configuration and arrangement as the second distribution pipe 32 according to the first exemplary embodiment, so a detailed explanation thereof is omitted.

The second distribution pipe 32 distributes and guides the etching solution that is distributed from the slot hole 611 of the first distribution pipe 61 included therein to the top of the substrate 5.

In the second exemplary embodiment of the present invention, the first distribution pipe can include a plurality of nozzles 311 (shown in FIG. 4) arranged at predetermined intervals in the y-axis direction in order to distribute the etching solution along the y-axis direction.

The nozzles 311 are formed downwardly in the second distribution pipe in order to primarily distribute the etching solution that is pressure-transferred from the sides of the first distribution pipe. That is, the first distribution pipe 61 according to the second exemplary embodiment can employ the nozzles 311 or the slot hole 611 in order to primarily distribute the etching solution even though the etching solution is distributed and supplied primarily and secondarily.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A substrate etching apparatus for etching a substrate comprising:
    a supporting unit supporting the substrate in a vertical position; and
    an etching solution supply unit disposed above the substrate, and supplying an etching solution to a top of the substrate such that the etching solution flows down both of a front and back faces of the substrate, the etching solution supply unit comprising:
        a first distribution pipe distributing an etching solution that is supplied from a pump unit;
        a second distribution pipe including the first distribution pipe and secondarily distributing the etching solution distributed by the first distribution pipe; and
        a guide including the second distribution pipe and guiding the etching solution distributed by the second distribution pipe to the top of the substrate.

2. The substrate etching apparatus of claim 1, wherein the supporting unit comprises:
    a first supporting member supporting the bottom of the substrate in the vertical position;
    a second supporting member supporting one side of the substrate in the vertical position; and
    a third supporting member supporting another side of the substrate in the vertical position.

3. The substrate etching apparatus of claim 2, wherein second supporting member is fixed in a position, and the third supporting member is movable to support or release the another side of the substrate.

4. The substrate etching apparatus of claim 3, wherein the first supporting member has a first concave groove to support the bottom of the substrate, the second supporting member has a second concave groove to support the one side of the substrate, and the third supporting member has a third concave groove to support the another side of the substrate.

5. The substrate etching apparatus of claim 1, wherein the first distribution pipe has a plurality of nozzles that distribute the etching solution, the nozzles being arranged downwardly.

6. The substrate etching apparatus of claim 5, wherein the second distribution pipe has an opening that is formed upwardly to distribute the etching solution, the opening having protrusions and depressions formed along the length of the second distribution pipe.

7. The substrate etching apparatus of claim 1, wherein the first distribution pipe has a slot hole that distributes the etching solution, the slot holes being formed downwardly.

8. The substrate etching apparatus of claim 7, wherein the second distribution pipe has an opening that is formed upwardly to distribute the etching solution, the opening having protrusions and depressions formed along the length of the second distribution pipe.

9. The substrate etching apparatus of claim 1, wherein the guide has an open top through which the etching solution spills, and the guide has a first side wall and a second side wall, both of which meet at a bottom of the guide forming a bottom line, the bottom line being aligned along the top of the substrate.

10. The substrate etching apparatus of claim 1, wherein the pump unit includes a first pump and a second pump, the first pump connected to one end of the first distribution pipe to supply the etching solution, the second pump connected to another end of the first distribution pipe to supply the etching solution.

11. The substrate etching apparatus of claim 1, wherein
    the second distribution pipe guides the etching solution distributed by the first distribution pipe to the top of the substrate.

12. The substrate etching apparatus of claim 11, wherein the first distribution pipe has a plurality of nozzles that distribute the etching solution, the nozzles being arranged downwardly.

13. The substrate etching apparatus of claim 12, wherein the second distribution pipe has an opening that is formed upwardly to distribute the etching solution, the opening having protrusions and depressions formed along the length of the second distribution pipe.

14. The substrate etching apparatus of claim 11, wherein the first distribution pipe has a slot hole that distributes the etching solution, the slot holes being formed downwardly.

15. The substrate etching apparatus of claim 14, wherein the second distribution pipe has an opening that is formed upwardly to distribute the etching solution, the opening having protrusions and depressions formed along the length of the second distribution pipe.

16. The substrate etching apparatus of claim 1, wherein the substrate includes an organic light emitting diode display.

17. A substrate etching system comprising:
    a first substrate etching apparatus for etching a substrate; and
    a second substrate etching apparatus for etching a substrate, each of the first and the second substrate etching apparatuses comprising:
        a supporting unit supporting the substrate in a vertical position; and
        an etching solution supply unit disposed above the substrate, and supplying an etching solution to a top of the substrate such that the etching solution flows down both of a front and a back faces of the substrate, the etching solution supply unit comprising:
            a first distribution pipe distributing an etching solution that is supplied from a pump unit;
            a second distribution pipe including the first distribution pipe and secondarily distributing the etching solution distributed by the first distribution pipe; and
            a guide including the second distribution pipe and guiding the etching solution distributed by the second distribution pipe to the top of the substrate;
wherein the first and the second substrate etching apparatuses are arranged in a manner that the faces of the substrates of the first and the second substrate etching apparatus face each other.

18. A substrate etching system comprising:
    a first substrate etching apparatus for etching a substrate; and
    a second substrate etching apparatus for etching a substrate, each of the first and the second substrate etching apparatuses comprising:
        a supporting unit supporting the substrate in a vertical position; and an etching solution supply unit disposed above the substrate, and supplying an etching solution to a top of the substrate such that the etching solution flows down both of a front and a back faces of the substrate, the etching solution supply unit comprising:
  a first distribution pipe distributing an etching solution that is supplied from a pump unit;
  a second distribution pipe including the first distribution pipe and secondarily distributing the etching solution distributed by the first distribution pipe; and
  a guide including the second distribution pipe and guiding the etching solution distributed by the second distribution pipe to the top of the substrate;
wherein the first and the second substrate etching apparatuses are arranged in a manner that the sides of the substrates of the first and the second substrate etching apparatus face each other.

* * * * *